United States Patent [19]

Pringle

[11] Patent Number: 5,241,316
[45] Date of Patent: Aug. 31, 1993

[54] USE OF ITERATION TO IMPROVE THE CORRECTION OF AGC DEPENDENT CHANNEL-TO-CHANNEL GAIN IMBALANCE

[75] Inventor: Richard C. Pringle, Van Nuys, Calif.
[73] Assignee: Hughes Aircraft Company, Los Angeles, Calif.
[21] Appl. No.: 765,799
[22] Filed: Sep. 26, 1991
[51] Int. Cl.$^5$ ............................................. G01S 7/34
[52] U.S. Cl. ...................................... 342/62; 342/92; 342/151; 342/174; 342/194
[58] Field of Search ................. 342/62, 92, 194, 151, 342/152, 174

[56] References Cited

U.S. PATENT DOCUMENTS

| | | | |
|---|---|---|---|
| 4,122,448 | 10/1978 | Martin | 342/171 |
| 4,616,229 | 10/1986 | Taylor, Jr. | 342/174 |
| 4,642,642 | 2/1987 | Uurtamo | 342/174 |
| 4,905,010 | 2/1990 | Baechtiger et al. | 342/151 |

*Primary Examiner*—John B. Sotomayor
*Attorney, Agent, or Firm*—Charles D. Brown; Randall M. Heald; Wanda K. Denson-Low

[57] ABSTRACT

A method and apparatus that uses iteration to achieve a better prediction of the values of the commands needed to balance the gains of $\Sigma+\Delta$ and $\Sigma-\Delta$ channels of a radar guidance system, when an imbalance occurs due to a change caused by the AGC circuitry. An improved method of measuring channel-to-channel gain imbalance versus AGC measurements is provided, which produces modified input values that are used as commands that correct the mismatch during missile flight so that residual error is minimized and more accurate guidance is achieved. The present method is implemented by measuring the gain imbalance at predetermined AGC points during system calibration, and iterating these measurements to produce a relatively small channel-to-channel gain imbalance at the $\Delta$AGC amplifiers. The measured imbalance is then converted to $\Delta$AGC commands and applied to the $\Delta$AGC amplifiers. The resulting gain imbalance is measured and this value is added to the originally measured value. This iterated value is again converted to $\Delta$AGC commands and applied to the $\Delta$AGC amplifiers, and again the imbalance is measured, and is added to the first measurement. This procedure is repeated until a satisfactory level of error is measured which produces the proper correction factor that balances the channel-to-channel gains for each value of AGC. These correction factors are stored in a lookup table and are subsequently applied to the missile during flight. The improved apparatus of the present invention comprises a $\Delta$AGC controller containing a lookup table that contains the correction factors determined using the above method and an amplifier control circuit that responds to the correction factors to apply modified gain factors to the $\Delta$AGC amplifiers. These correction factors are applied to the $\Delta$AGC amplifiers during operation of the guidance system to achieve more accurate missile guidance.

3 Claims, 3 Drawing Sheets

USE OF ITERATION TO IMPROVE THE CORRECTION OF AGC DEPENDENT CHANNEL-TO-CHANNEL GAIN IMBALANCE

BACKGROUND

The present invention relates generally to automatic gain control (AGC) circuits, and more particularly, to methods and apparatus that correct AGC-dependent gain imbalance using iteration in such AGC circuits.

In certain radar guidance systems, the amplitudes of the sum ($\Sigma$) and delta ($\Delta$) signals received at its antenna are processed to derive the angle of a radar return relative to the antenna boresight. It is common in such systems to combine the sum and delta signals into two channels ($\Sigma+\Delta$) and ($\Sigma-\Delta$) after their frequencies have been translated to an intermediate frequency. These two channels are independently processed, and then combined to recover the sum and delta amplitudes, which are used to produce the angle of the return.

Any hardware induced gain difference between the two channels results in the calculated angle being corrupted by a bias, which degrades the performance of the guidance system. One possible hardware source of gain imbalance is a differential change to the gain of each channel as a result of a change to its automatic gain control (AGC) circuit. A conventional technique to correct for this occurrence is to measure channel-to-channel gain imbalance versus AGC during a calibration cycle, and to use these measurements as commands that correct the mismatch.

Since processing of the amplitudes of sum and delta channels yield the angle information, they must be accurately maintained throughout the processing chain. This requires that the gains of the $\Sigma+\Delta$ and $\Sigma-\Delta$ channels are matched during the time period when sum-delta processing takes place. Any mismatch between the gain of the $\Sigma+\Delta$ channel and the gain of the $\Sigma-\Delta$ channel results in a bias error in the calculation of the angle of the return. It is the function of "delta automatic gain control" ($\Delta$AGC) circuitry in such systems (comprising a $\Delta$AGC controller and $\Delta$AGC controlled amplifiers) to measure the channel-to-channel gain imbalance, and to automatically correct it before angle processing begins.

More particularly, in some radar systems, large changes in channel-to-channel gain result from changes in the overall system gain due to automatic gain control (AGC). One technique used to compensate for this is to characterize the required $\Delta$AGC change needed to balance the two channels for any change in AGC, so that the change in $\Delta$AGC may be predicted once the change in AGC is known. This characterization is done during a period of time dedicated to system calibration. A test signal is applied to the guidance system which has been configured such that the delta channel amplitude is zero. This results in the $\Sigma+\Delta$ and $\Sigma-\Delta$ channels containing only the sum information. Thus, any difference in the amplitudes of the signals between the two channels is due to channel-to-channel gain imbalance. This imbalance is measured for various levels of AGC (each level consistently larger or smaller than the last), with the $\Delta$AGC circuit removed from the processing chain so that it does not provide channel-to-channel gain balancing. Each imbalance measurement is the level that the $\Delta$AGC must achieve in the hardware to balance the channel-to-channel gains for that particular AGC value.

In this way, a table is generated and stored in the $\Delta$AGC controller that consists of the AGC points where the measurements were taken, and the slopes of these measurements between consecutive AGC points. For example, if at AGC level $AGC_n$ the channel-to-channel gain imbalance is $\Delta_n$, and at $AGC_{n+1}$ the imbalance is $\Delta_{n+1}$, then the table value for $AGC_n$ is: $(\Delta_{n+1}-\Delta_n)\div(AGC_{n+1}-AGC_n)$. During angle processing, if a change in AGC is to occur, the beginning and ending values of AGC along with the current value of the $\Delta$AGC command are used in conjunction with the information in this table to derive the new $\Delta$AGC command which compensates for the predicted change in channel-to-channel gain caused by the change in AGC.

However, although adequate performance is achieved with this conventional approach, it has been found that it is possible to achieve better performance utilizing the principles of the present invention.

SUMMARY OF THE INVENTION

In order to improve the performance of AGC control circuitry for use in a missile radar guidance system, or the like, the present invention provides for a method and apparatus that uses iteration to achieve a better prediction for the values of the commands needed to balance the gains of the $\Sigma+\Delta$ and $\Sigma-\Delta$ channels of the missile radar guidance system, when an imbalance occurs due to a change caused by the AGC circuitry. The present invention improves the conventional technique that measures channel-to-channel gain imbalance versus AGC during calibration. This calibration occurs when the missile is activated, typically during a predetermined calibration period. The present invention employs an improved method of taking these measurements, and these measurements are then used as commands that correct the mismatch during missile flight so that residual error is minimized and more accurate guidance is achieved.

A predetermined correction curve is generated (at the factory) that represents the "average" (for all systems manufactured to a particular specification) control input to the $\Delta$AGC amplifiers required to achieve the commanded gain. This correction curve is used for all such missiles, regardless of individual hardware differences. Consequently, for missiles that are not matched to the "average" correction curve, guidance errors are generated and applied to the missile guidance system that are particular for each missile system. The present system and method uses iteration to determine a set of revised input values that are applied as inputs to the "average" correction curve that adjust the output derived from the correction curve to more accurately control the $\Delta$AGC amplifiers. This results in proper guidance signals being applied to the missile.

In the present system and method, during system calibration which occurs at missile system turn-on, a $\Delta$AGC controller is used to compute channel-to-channel gain correction factors which are stored in a lookup table and then used as inputs to an amplifier control circuit incorporating the "average" correction curve to produce inputs to $\Delta$AGC controlled amplifiers. The values stored in the lookup table appropriately modify the output of the amplifier control circuit to compensate for the actual $\Delta$AGC amplifier hardware that is in the missile. The improved correction provided by the present invention results in the channel-to-channel gain correction applied to the ΔAGC amplifiers equalling the desired (commanded) value. Therefore, true correction is achieved in spite of the differences between correction signals that would normally be generated by the "average" correction curve. Therefore, the present method and apparatus more accurately compensates for manufacturing errors in the production of the guidance system hardware, and particularly the gain control amplifiers.

The present system and method is implemented by measuring the gain imbalance at predetermined AGC points (typically four) during system calibration. A test signal is applied to the guidance system and the system is configured such that the delta channel amplitude is zero. This results in the Σ+Δ and Σ−Δ channels containing only sum information. Thus, any difference in the amplitudes of the signals between the two channels is due to channel-to-channel gain imbalance.

For each particular AGC point the input value applied to the amplifier control circuitry is iterated a predetermined number of times until a desired level of gain imbalance (and hence ΔAGC correction) is achieved for that value of AGC. The iterative process iterates and adjusts the input values to the amplifier control circuitry such that the correction signal values provided to the ΔAGC amplifiers is sufficient to properly correct for the gain imbalance. The newly determined ΔAGC points are stored in the lookup table for use by the missile during flight. ΔAGC values other than the computed ΔAGC points are determined by interpolation.

More specifically, to find the ΔAGC values, during system calibration, the channel-to-channel gain mismatch is found for each possible given value of AGC. This measured imbalance is then transformed using a ΔAGC function and applied to the ΔAGC amplifiers. The resulting gain imbalance is measured and this value is added to the originally measured value. This iterated value is again transformed and applied to the ΔAGC amplifiers, and again the imbalance is measured, and is added to the modified first measurement. This procedure is repeated until a satisfactory level of error is measured which produces the proper correction factor that balances the channel-to-channel gains for that specific value of AGC.

The improved apparatus of the present invention comprises a ΔAGC controller that is used in conjunction with test signal generation circuitry that is employed during missile system calibration. The ΔAGC controller contains a lookup table that stores the modified gain correction signals determined using the above method, and an amplifier control circuit that contains the correction curve that is used to apply control signals to the ΔAGC amplifiers in response to the derived gain correction signals. These correction signals are applied to the ΔAGC amplifiers by way of the amplifier control circuitry during operation of the guidance system to achieve better performance.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
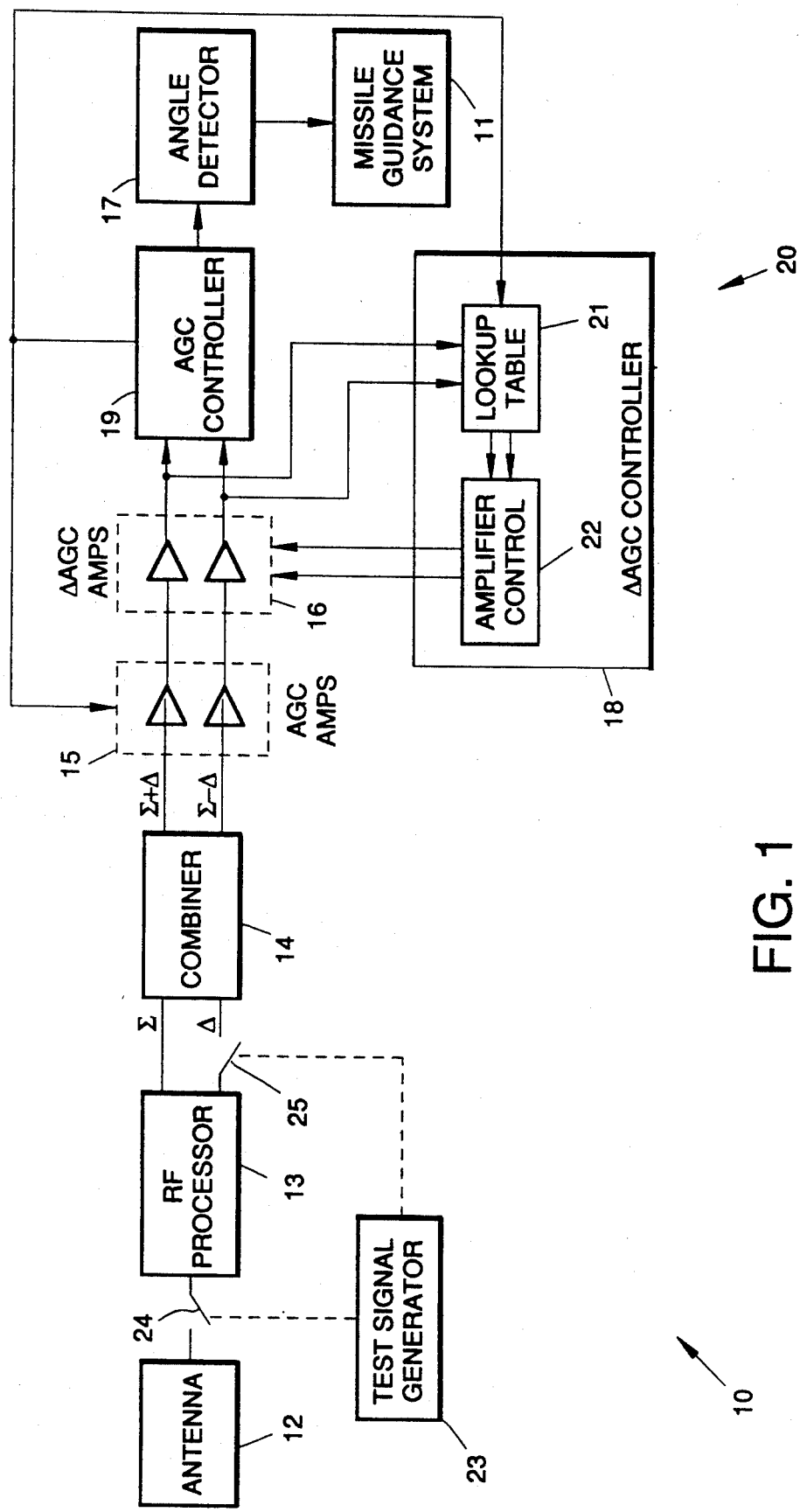
FIG. 1 is a block diagram of an AGC circuit for use with a missile guidance system that incorporates the principles of the present invention.

Referring to the drawing figures, FIG. 1 is a block diagram of a radar system 10 incorporating an AGC circuit 20 for use with a missile guidance system 11 that incorporates the principles of the present invention. The radar system 10 comprises an antenna 12 that is coupled to an RF processor 13 that is adapted to produce sum (Σ) and delta (Δ) output signals. The sum and delta output signals are coupled to a combiner 14 that produces Σ+Δ and Σ−Δ output signals.

The Σ+Δ and Σ−Δ output signals are serially coupled through AGC-controlled amplifiers 15 and ΔAGC-controlled amplifiers 16 through an AGC controller 19 to an amplitude angle detector 17. Output signals from the ΔAGC controlled amplifiers 16 are coupled to a ΔAGC controller 18 which provides feedback control signals to the ΔAGC controlled amplifiers 16. Output signals from the ΔAGC controlled amplifiers 16 are coupled to an AGC controller 19 which provides feedback control signals to the AGC controlled amplifiers 15, and AGC commands to the ΔAGC controller 18. Output signals from the angle detector 17 are coupled to the missile guidance system 11, which output signals are adapted to steer the missile.

The ΔAGC controller 18 includes a lookup table 21 that comprises a memory device, and an amplifier control circuit 22. The amplifier control circuit 22 contains circuitry which applies input signal to the ΔAGC controlled amplifiers 16 in response to input signal derived from the lookup table 21. A test signal generator 23 is coupled to the input to the RF processor 13 and to the output thereof such that a test signal can be applied to the RF processor 13 and such that the combiner 14 is configured such that the applied delta channel amplitude is zero. This is accomplished in a conventional manner, herein represented by means of switches 24, 25.

The present method and apparatus are used to compensate for the changes in system channel-to-channel gain due to changes in the automatic gain control circuitry. In the prior art system, instantaneous AGC changes cause large angle jumps and therefore cause tracking problems for the missile guidance system 11. The present invention is adapted to alleviate these tracking problems in the following manner. The present method characterizes the required ΔAGC change needed to balance the Σ+Δ and Σ−Δ channels for any change due to AGC related errors, so that the change in ΔAGC is predicted once the change in AGC is known. This characterization is done during calibration of the radar system 10 at the time that the system 10 and missile 11 are activated. A test signal is applied to the guidance system at the input to the RF processor 13 and the combiner 14 is configured such that the Δ channel amplitude is zero. This is accomplished by applying the test signal from the test signal generator 23 that employs the switches 24 to interrupt the signal line between the antenna 12 and the RF processor 13 and that controls the signal outputs from the RF processor using the switch 25.

This results in the $\Sigma+\Delta$ and $\Sigma-\Delta$ channels containing only sum information. Thus, any difference in the amplitudes of the signals between the two channels is due to channel-to-channel gain imbalance. This imbalance is measured for various levels of AGC (each level consistently larger or smaller than the last), with the $\Delta$AGC circuit out of the circuit so as not to provide channel-to-channel gain balancing. Typically four points are measured. Each imbalance measurement is the level that the $\Delta$AGC controller 18 must apply to the $\Delta$AGC amplifiers 16 in order to balance the channel-to-channel gains for that particular AGC value.

In this way, the lookup table 21 is generated and stored in the $\Delta$AGC controller 18 that comprises the AGC points where the measurements were taken, and the slopes of these measurements between consecutive AGC points. For example, if at AGC level $AGC_n$ the channel-to-channel gain imbalance is $\Delta_n$, and at $AGC_{n+1}$, the imbalance is $\Delta_{n+1}$, then the table value for $AGC_n$ is: $(\Delta_{n+1}-\Delta_n) \div (AGC_{n+1}-AGC_n)$. During angle processing, if a change in AGC occurs, the beginning and ending values of AGC along with the current value of the $\Delta$AGC command are used in conjunction with the information in the lookup table 21 to derive a new $\Delta$AGC command that compensates for the predicted change in channel-to-channel gain caused by the change in AGC.

Figure 2:
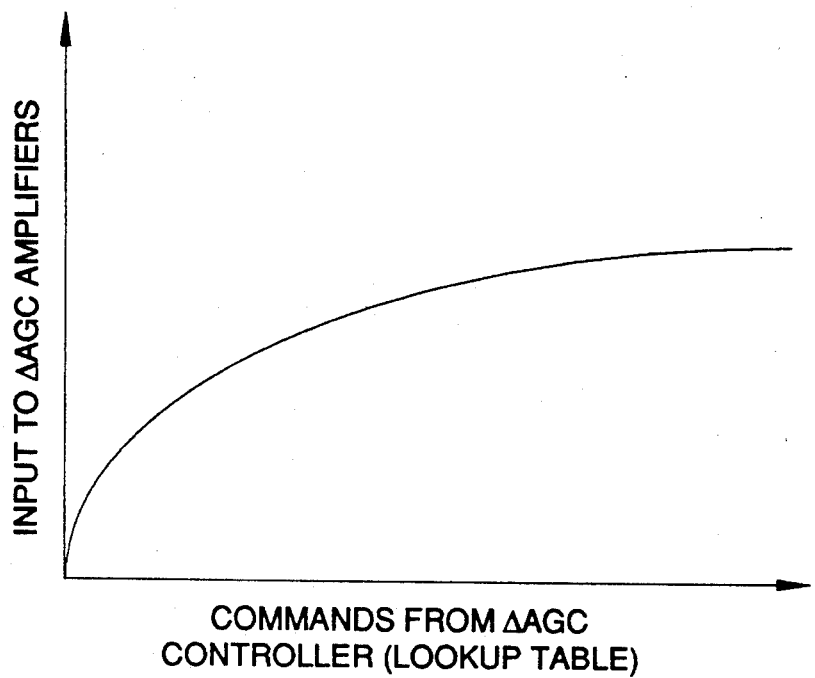
FIG. 2 is a graph of signal input to ΔAGC amplifiers versus the command from a ΔAGC controller in the circuit of FIG. 1.

In the present method the gain imbalance is measured at particular AGC points during radar system calibration, and these measurements are also used to determine, through iteration, the value, which when transformed by the $\Delta$AGC function and applied to the $\Delta$AGC-controlled amplifiers 16 will compensate for the mismatch, and produce a relatively small channel-to-channel gain imbalance. To find the value of the $\Delta$AGC function, during system calibration, the channel-to-channel gain mismatch is found for a given value of AGC. This measured imbalance is then transformed by the $\Delta$AGC function and input to the $\Delta$AGC controlled amplifiers 16. The resulting gain imbalance is remeasured and this value is added to the original measurement. This iteration is again transformed and input to the $\Delta$AGC controlled amplifiers 16, and again the imbalance is measured, and is now added to the modified first measurement. This procedure is repeated until a satisfactory level of error is measured yielding the value of the proper input to the $\Delta$AGC function which will balance the channel-to-channel gains for that value of AGC. FIG. 2 is a graph of signal input to $\Delta$AGC controlled amplifiers 16 versus the command from the lookup table 21 in the $\Delta$AGC controller 18 in the radar system 10 of FIG. 1 that is needed to balance the channel-to-channel gains. In the present method, the $\Delta$AGC controller 18 transforms the desired channel-to-channel gain correction using the $\Delta$AGC function which produces an input to the $\Delta$AGC amplifiers 16 that results in the channel-to-channel gain correction. The gain correction provided by the $\Delta$AGC controller 18 and $\Delta$AGC amplifiers 16 substantially equals the desired (commanded) value.

Figure 3:
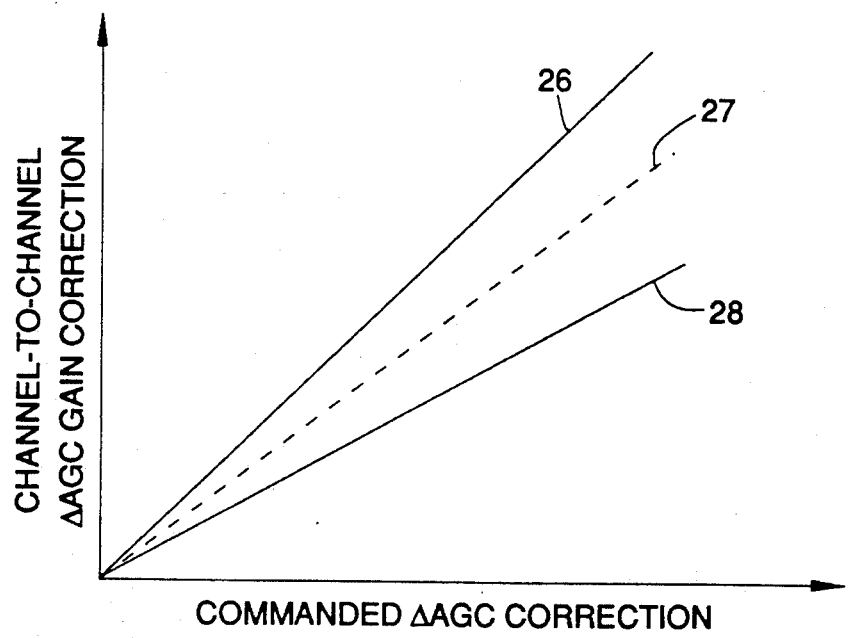
FIG. 3 is a graph of applied correction signal versus commanded correction of the channel-to-channel gain implemented in the circuit of FIG. 1.

FIG. 3 is a graph of $\Delta$AGC correction signal versus commanded $\Delta$AGC correction of the channel-to-channel gain in the circuit 20 of FIG. 1. These curves are shown as linear for the purposes of simplicity, and are not to be considered as actual results. Curve 28 shows a non-ideal situation wherein the correction value is proportional to the commanded correction value by a factor "$\beta$", wherein $0 \leq \beta \leq 1$. Curve 26 shows the ideal situation wherein the achieved correction is equal to the commanded correction, i.e. $\beta=1$. Curve 27 shows a situation wherein the achieved correction approaches the ideal value of the commanded correction as more iterations are made using the method of the present invention.

Figure 4:
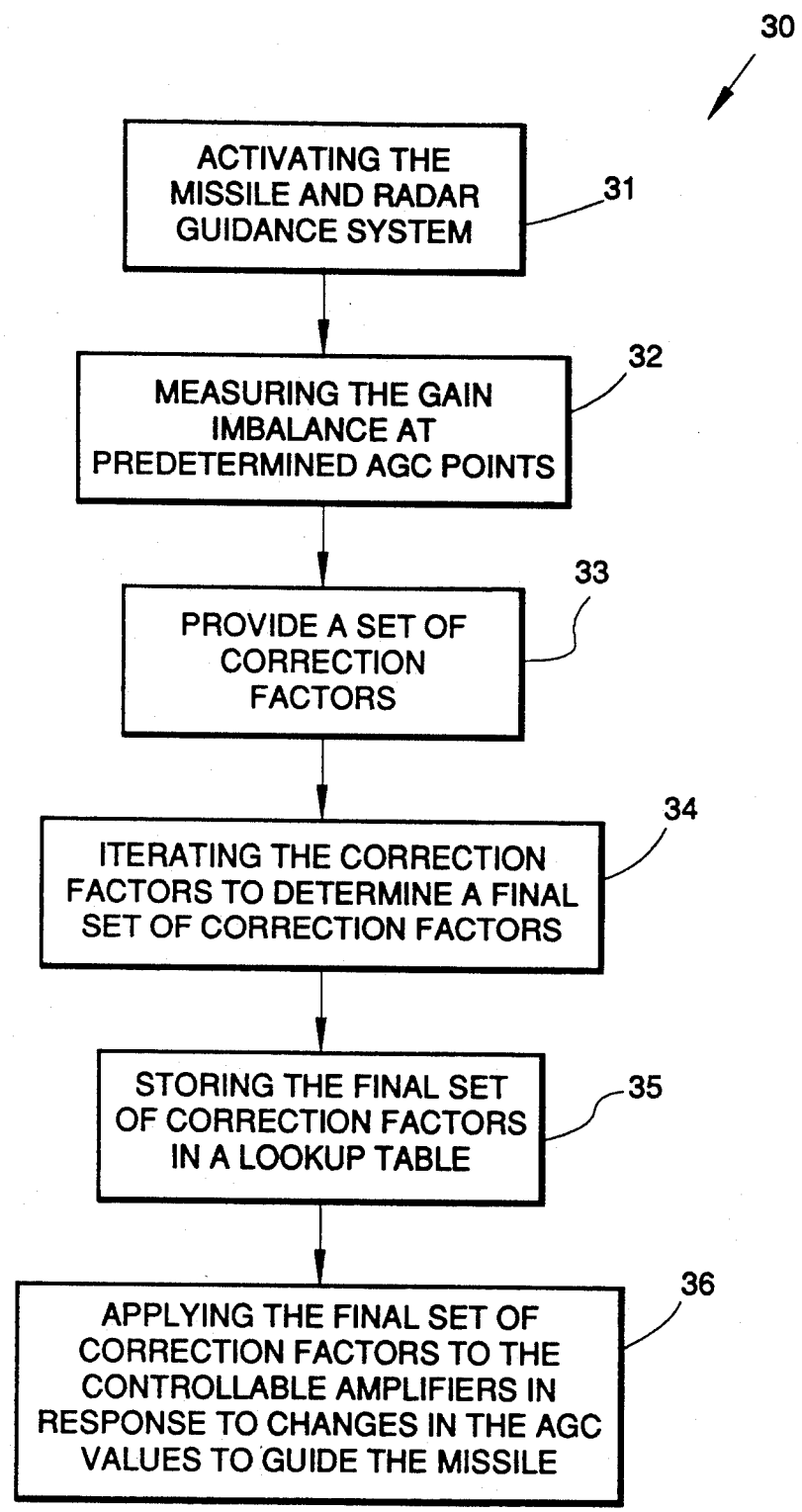
FIG. 4 illustrates a flow chart representative of one method in accordance with the principles of the present invention.

FIG. 4 illustrates a flow chart representing one method 30 in accordance with the principles of the present invention. The method 30 is used in the radar guidance system 10 employed in the missile 11, for example. The radar guidance system 10 has delta automatic gain control ($\Delta$AGC) circuitry comprising the controller 18 having the lookup table 21, and wherein the controller 18 is coupled to the controllable gain control amplifiers 16. The method 30 is a method of balancing the gains of $\Sigma+\Delta$ and $\Sigma-\Delta$ channels of the radar guidance system 10 when an imbalance occurs due to a change caused by the AGC circuitry. The method 30 comprises the following steps. Activating the missile and radar guidance system 10, as is indicated by box 31. Measuring the gain imbalance at predetermined AGC points during radar guidance system calibration, as is indicated by box 32, and providing a set of correction factors indicative thereof, as is indicated by box 33. Iterating the correction factors by applying the correction factors to the controllable amplifiers 16 to determine a final set of correction factors that balances the $\Sigma+\Delta$ and $\Sigma-\Delta$ channels of the radar guidance system 10 for each possible AGC value, as is indicated by box 34. Storing the final set of correction factors in the lookup table 21, as is indicated by box 35. Applying the final set of correction factors to the controllable amplifiers 16 in response to changes in the AGC values to more accurately guide the missile 11, as is indicated by box 36.

An example of the present method is presented below. Assume that the $\Delta$AGC function plus the hardware error achieves $\beta c$ channel-to-channel gain ($0 \leq \beta \leq 1$) when it receives an input c. The error between the achieved channel-to-channel gain and the commanded channel-to-channel gain is then $c-\beta c$ or $c(1-\beta)$. If c is the channel imbalance at a particular AGC, and is used as a command to the $\Delta$AGC amplifiers 16 when the AGC command value reaches this value, the channels will still have an imbalance equal to $c(1-\beta)$. If, however, during system calibration, the command required to balance the channels is allowed to iterate, the error achieved when using this iterated command value will be less than that achieved without it. The iterations and the resulting channel balancing errors are as follows in Table 1:

TABLE 1

| No. | Command | Error |
|---|---|---|
| 1 | 0 | c |
| 2 | c | $c - \beta c = c(1 - \beta)$ |
| 3 | $c + c(1 - \beta) = 2c - \beta c$ | $c - 2\beta c + \beta^2 c = c(1 - 2\beta + \beta^2) = c(1 - \beta)^2$ |
| 4 | $2c - \beta c + c(1 - 2\beta + \beta^2) = 3c - 3\beta c + \beta^2 c$ | $c - 3\beta c + 3\beta^2 c - \beta^3 c = c(1 - 3\beta + 3\beta^2 + \beta^3) = c(1 - \beta)^3$ |
| 5 | $3c - 3\beta c + \beta^2 c + c(1 - 3\beta + 3\beta^2 - \beta^3 c) + c(1 - 3\beta + 3\beta^2 - \beta^3 c) =$ | $c - 4\beta c + 6\beta^2 - 4\beta^3 c + \beta^4 c = c(1 - 4\beta + 6\beta^2 - 4\beta^3 + \beta^4) = c(1 - \beta)^4$ |

TABLE 1-continued

| No. | Command | Error |
|---|---|---|
|  | $4c - 6\beta c + 4\beta^2 c - \beta^3 c$ |  |

Thus, for the $k^{th}$ command, the error is $c(1-\beta)^{k-1}$.

The following Table 2 compares the errors for no iterations versus four iterations for various values of $\beta$.

TABLE 2

| $\beta$ | Error (no iterations) $c(1 - \beta)$ | Error (four iterations) $c(1 - \beta)^4$ |
|---|---|---|
| 0.0 | c | c |
| 0.1 | 0.9c | 0.656c |
| 0.2 | 0.8c | 0.410c |
| 0.3 | 0.7c | 0.240c |
| 0.4 | 0.6c | 0.130c |
| 0.5 | 0.5c | 0.065c |
| 0.6 | 0.4c | 0.026c |
| 0.7 | 0.3c | 0.0081c |
| 0.8 | 0.2c | 0.0016c |
| 0.9 | 0.1c | 0.0001c |
| 1.0 | 0.0 | 0.0 |

Thus there has been described a new and improved AGC correction circuit and method for use in a missile radar guidance system which corrects AGC-dependent channel-to-channel gain imbalance by using iteration of gain correction factors. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. In a radar guidance system for use in a missile, the radar guidance system having automatic gain control (AGC) circuitry that comprises a controller having a lookup table, and wherein the controller is coupled to controllable gain control amplifiers, a method of balancing the gains of $\Sigma+\Delta$ and $\Sigma-\Delta$ channels of the radar guidance system when an imbalance occurs due to a change caused by the controllable gain control amplifiers, said method comprising the steps of:

activating the missile and radar guidance system;

measuring the gain imbalance at predetermined AGC points during radar guidance system calibration subsequent to activation of the missile and providing a set of correction factors indicative thereof;

iterating the correction factors by applying the correction factors to the controllable amplifiers to determine a final set of correction factors that balances the $\Sigma+\Delta$ and $\Sigma-\Delta$ channels of the radar guidance system for each possible AGC value;

storing the final set of correction factors in the lookup table;

applying the final set of correction factors to the controllable amplifiers in response to changes in the AGC values to more accurately guide the missile.

2. In a radar guidance system for use in a missile, the radar guidance system having automatic gain control (AGC) circuitry that comprises a controller having a lookup table, and wherein the controller is coupled to controllable gain control amplifiers, a method of balancing the gains of $\Sigma+\Delta$ and $\Sigma-\Delta$ channels of the radar guidance system when an imbalance occurs due to a change caused by the controllable gain control amplifiers, and wherein the channel-to-channel gain correction provided to the controllable amplifiers substantially equals a desired value, said method comprising the steps of:

activating the missile and radar guidance system;

measuring the gain imbalance at a plurality of predetermined AGC points during radar guidance system calibration subsequent to activation of the missile and computing a set of correction factors indicative thereof;

iterating the correction factors by applying the correction factors to the controllable amplifiers a predetermined number of times to determine a final set of correction factors that balances the $\Sigma+\Delta$ and $\Sigma-\Delta$ channels of the radar guidance system for each possible AGC value;

storing the final set of correction factors in the lookup table;

applying the final set of correction factors to the controllable amplifiers in response to changes in the AGC values to more accurately guide the missile.

3. In a radar guidance system having automatic gain control (AGC) circuitry that comprises a controller having a lookup table, and wherein the controller is coupled to controllable amplifiers, a method of balancing the gains of $\Sigma+\Delta$ and $\Sigma-\Delta$ channels of the radar guidance system when an imbalance occurs due to a change caused by the AGC circuitry, said method comprising the steps of:

activating the missile and radar guidance system;

calibrating the system by measuring gain imbalance value between the $\Sigma+\Delta$ and $\Sigma-\Delta$ channels for a selected one of a plurality of predetermined AGC input values;

computing a gain correction factor for the selected predetermined AGC input value and applying the gain correction factor to the controllable amplifiers;

remeasuring the resulting gain imbalance value in response to the applied gain correction factor and adding this value to the previously measured gain correction factor;

repeating the computing and remeasuring steps for the selected AGC input value until a desired level of error is measured, thus providing a gain correction factor that balance the channel-to-channel gains for the selected AGC value; and repeating the above calibrating, computing, and remeasuring steps for each AGC input value of the plurality of predetermined AGC input values to produce a final set of gain correction factors, and wherein the channel-to-channel gain correction provided by the controllable amplifiers in response to the final set of correction factors substantially balances the $\Sigma+\Delta$ and $\Sigma-\Delta$ channels of the radar guidance system;

storing the final set of correction factors in the lookup table; and applying the final set of correction factors to the controllable amplifiers in response to changes in the AGC values during missile flight to more accurately guide the missile.

* * * * *